(12) United States Patent
Steinhaeusser et al.

(10) Patent No.: US 11,894,829 B2
(45) Date of Patent: Feb. 6, 2024

(54) VARIATION OF METAL LAYER STACK UNDER UNDER BUMP METALLIZATION (UBM)

(71) Applicant: RF360 Singapore Pte. Ltd., Singapore (SG)

(72) Inventors: Ute Steinhaeusser, Munich (DE); Niklaas Konopka, Munich (DE); Alexander Landel, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 349 days.

(21) Appl. No.: 16/854,769

(22) Filed: Apr. 21, 2020

(65) Prior Publication Data
US 2021/0143790 A1   May 13, 2021

Related U.S. Application Data

(60) Provisional application No. 62/934,910, filed on Nov. 13, 2019.

(51) Int. Cl.
| | |
|---|---|
| *H03H 9/05* | (2006.01) |
| *H01L 23/00* | (2006.01) |
| *H03H 9/64* | (2006.01) |
| *H03H 3/08* | (2006.01) |
| *H10N 30/06* | (2023.01) |
| *H10N 30/87* | (2023.01) |

(52) U.S. Cl.
CPC ............. *H03H 9/059* (2013.01); *H01L 24/03* (2013.01); *H01L 24/05* (2013.01); *H01L 24/11* (2013.01); *H01L 24/13* (2013.01); *H03H 3/08* (2013.01); *H03H 9/64* (2013.01); *H10N 30/06* (2023.02); *H10N 30/875* (2023.02); *H10N 30/877* (2023.02); *H01L 2224/0401* (2013.01); *H01L 2224/05084* (2013.01); *H01L 2224/05124* (2013.01); *H01L 2224/05147* (2013.01); *H01L 2224/05166* (2013.01); *H01L 2224/05171* (2013.01); *H01L 2224/05184* (2013.01); *H01L 2224/05655* (2013.01); *H01L 2924/0132* (2013.01)

(58) Field of Classification Search
CPC ......... H01L 24/03; H01L 24/05; H01L 24/11; H01L 24/13; H01L 41/0475; H01L 41/0477; H01L 41/29
See application file for complete search history.

(56) References Cited

U.S. PATENT DOCUMENTS

| | | | | |
|---|---|---|---|---|
| 9,484,291 | B1 * | 11/2016 | Dhandapani | H01L 24/03 |
| 2004/0004284 | A1 * | 1/2004 | Lee | H01L 21/76804 |
| | | | | 438/618 |
| 2012/0319251 | A1 * | 12/2012 | Yu | H01L 24/05 |
| | | | | 257/632 |

(Continued)

FOREIGN PATENT DOCUMENTS

| | | | | |
|---|---|---|---|---|
| WO | WO-2016087329 A1 * | 6/2016 | | H03H 9/1057 |

*Primary Examiner* — Christine A Enad
(74) *Attorney, Agent, or Firm* — Loza & Loza LLP

(57) ABSTRACT

In certain aspects, a chip includes a pad, and a first passivation layer, wherein a first portion of the first passivation layer extends over a first portion of the pad. The chip also includes a first metal layer between the first portion of the pad and the first portion of the first passivation layer. The chip further includes an under bump metallization (UBM) electrically coupled to a second portion of the pad.

30 Claims, 15 Drawing Sheets

(56) References Cited

U.S. PATENT DOCUMENTS

2013/0043583 A1\* 2/2013 Wu ........................ H01L 24/06
  257/737
2016/0322319 A1\* 11/2016 Aoki ....................... H01L 24/13
2019/0288667 A1\* 9/2019 Hayashi ............. H03H 9/02574

\* cited by examiner

VARIATION OF METAL LAYER STACK UNDER UNDER BUMP METALLIZATION (UBM)

RELATED APPLICATION

This application claims priority under 35 U.S.C. § 119(e) to U.S. Provisional Application No. 62/934,910 filed on Nov. 13, 2019, the entire specifications of which are incorporated herein by reference.

BACKGROUND

Field

Aspects of the present disclosure relate generally to chip bumping.

Background

Chip bumping may be used to electrically couple a chip to external circuitry using solder bumps (also referred to as solder balls). In this regard, the chip includes pads electrically coupled to one or more devices integrated on the chip. An under bump metallization (UBM) may be deposited on each of the pads, and a solder bump may be deposited on each UBM. After deposition of the solder bumps, the chip may be flipped over and placed on a substrate (e.g., a printed circuit board) in which the solder bumps are aligned with corresponding pads on the substrate. The pads on the substrate may be electrically coupled to the external circuitry (e.g., via metal lines on the substrate and/or embedded in the substrate).

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

Certain aspects relate to a chip. The chip includes a pad, and a first passivation layer, wherein a first portion of the first passivation layer extends over a first portion of the pad. The chip also includes a first metal layer between the first portion of the pad and the first portion of the first passivation layer. The chip further includes an under bump metallization (UBM) electrically coupled to a second portion of the pad.

A second aspect relates to a method of manufacture. The method includes forming a pad, depositing a metal layer on the pad, and depositing a passivation layer over the metal layer. The method also includes removing a portion of the passivation layer and a portion of the metal layer to expose a portion of the pad, and depositing an under bump metallization (UBM) on the portion of the pad.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
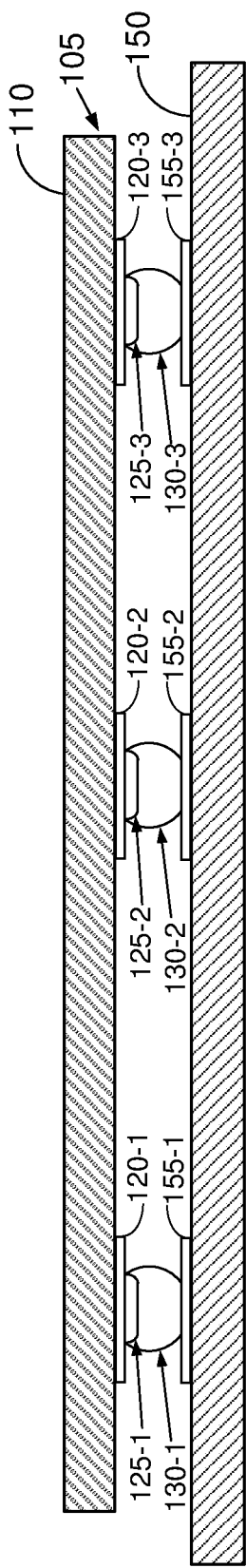
FIG. 1 shows an example of a chip coupled to a substrate using solder bumps according to certain aspects of the present disclosure.

Chip bumping (also referred to as wafer bumping) may be used to electrically couple one or more devices on a chip to external circuitry using one or more solder bumps. In this regard, FIG. 1 shows an example of a chip 105 electrically coupled to a substrate 150 using chip bumping according to aspects of the present disclosure. In this example, the chip 105 includes a substrate 110 (e.g., a silicon substrate), and multiple pads 120-1 to 120-3 electrically coupled to one or more devices (not shown in FIG. 1) formed on the substrate 110. The chip 105 also includes an under bump metallization (UBM) 125-1 to 125-3 deposited on each of the pads 120-1 to 120-3, and a solder bump 130-1 to 130-3 deposited on each of the UBMs 125-1 to 125-3. The UBMs 125-1 to 125-3 may be used, for example, to prevent metal diffusion from the solder bumps 130-1 to 130-3 to the pads 120-1 to 120-3. The pads 120-1 to 120-3 (also referred to as bonding pads) may each comprise aluminum, copper, aluminum copper (AlCu) alloy, and/or other metal(s). The UBMs 125-1 to 125-3 may each comprise nickel with a thin outer layer of gold and/or palladium (i.e., NiAu, NiPd or NiPdAu), as discussed further below. Each UBM 125-1 to 125-3 may be deposited using electroless deposition (i.e., electroless UBM).

After deposition of the solder bumps 130-1 to 130-3, the chip 105 may be flipped over and placed on the substrate 150 such that the solder bumps 130-1 to 130-3 are aligned with corresponding pads 155-1 to 155-3 on the substrate 150. The pads 155-1 to 155-3 may be electrically coupled to external circuitry (not shown in FIG. 1). For example, the pads 155-1 to 155-3 may be electrically coupled to the external circuitry via metal lines (not shown) on the substrate 150 and/or embedded in the substrate 150. The substrate 150 may include a printed circuit board (PCB), a ceramic substrate, etc. Note that FIG. 1 shows an example in which the chip 105 is orientated face down since the chip is flipped over in this example (e.g., flip chip).

In this example, the solder bumps 130-1 to 130-n provide electrical coupling between the chip 105 and the substrate 150. The solder bumps 130-1 to 130-n may also provide mechanical support for the chip 105 on the substrate 150. An underfill (not shown) made of an electrically non-conductive material may be used to fill spaces between the chip 105 and the substrate 150.

Although three solder bumps 130-1 to 130-3 are shown in the example in FIG. 1, it is to be appreciated that the chip 105 may include a different number of solder bumps. It is to be appreciated that FIG. 1 is not necessarily drawn to scale.

Figure 2A:
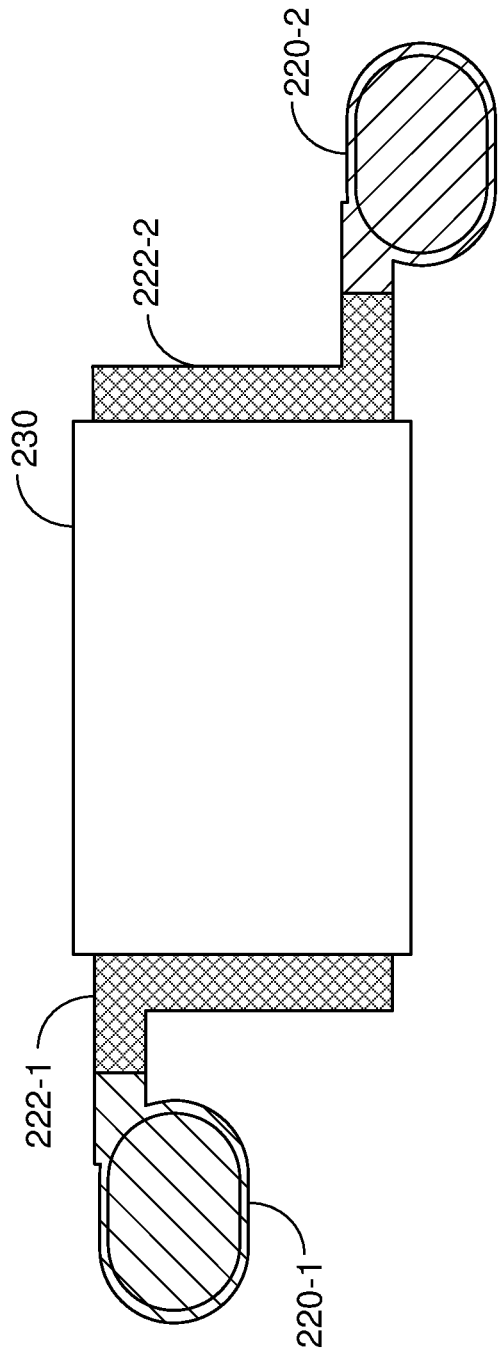
FIG. 2A shows an example of pads coupled to a device on a chip according to certain aspects of the present disclosure.

FIG. 2A shows an example of a device 230 electrically coupled to pads 220-1 to 220-2 via respective interconnects 222-1 to 222-2. The device 230 may be integrated on the chip 105, and each of the pads 220-1 to 220-2 may correspond to a respective one of the pads 120-1 to 120-3 shown in FIG. 1. Each of the interconnects 222-1 to 222-2 may comprise one or more metal layers (also referred to as metallization layers) formed on the substrate 110. Each of the interconnects 222-1 to 222-2 is electrically coupled between the respective one of the pads 222-1 to 222-2 and the device 230. In this example, the pads 220-1 to 220-2 allow the device 230 to be electrically coupled to external circuitry using chip bumping, as discussed above. The device 230 may include a filter (e.g., a surface acoustic wave (SAW) filter), an amplifier (e.g., a power amplifier, a low noise amplifier, etc.) and/or another type of device. As discussed further below, one or more passivation layers may be deposited over the device 230 to protect the device 230 from the outside environment.

It is to be appreciated that the locations of the pads 220-1 and 220-2 shown in FIG. 2A are exemplary, and that the pads 220-1 to 220-2 may be placed in various locations relative to the device 230. It is also to be appreciated that FIG. 2A is not necessarily drawn to scale.

Figure 2B:
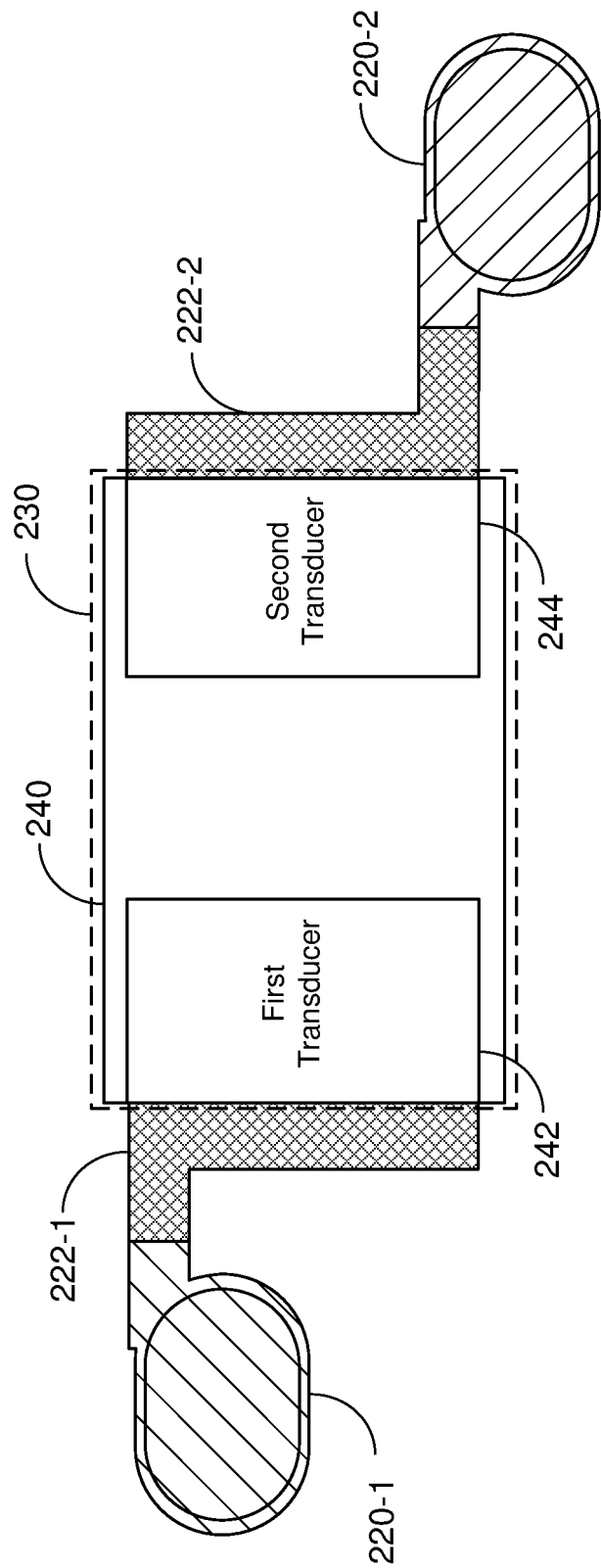
FIG. 2B shows an example in which the device in FIG. 2A includes a surface acoustic wave (SAW) filter according to certain aspects of the present disclosure.

FIG. 2B shows an example in which the device 230 shown in FIG. 2A is a SAW filter.

In this example, the device 230 includes a piezoelectric layer 240, a first transducer 242, and a second transducer 244. The first transducer 242 is formed on a first portion of the piezoelectric layer 240, and is electrically coupled to a first one of the pads 220-1 via a first one of the interconnects 222-1. The second transducer 244 is formed on a second portion of the piezoelectric layer 240, and is electrically coupled to a second one of the pads 220-2 via a second one of the interconnects 222-2.

The first transducer 242 may be configured to receive a first electrical signal via the first pad 220-1 and convert the electrical signal into a surface acoustic wave that propagates along the piezoelectric layer 240 to the second transducer 244. The second transducer 244 may be configured to convert the surface acoustic wave into a second electrical signal and output the second electrical signal via the second pad 220-2. The first and second electrical signals may each include a radio frequency (RF) signal, an intermediate frequency (IF) signal, etc.

In one example, each of the first and second transducers 242 and 244 may comprise an interdigital transducer that includes interleaved metal electrodes (not shown in FIG. 2B) deposited on the surface of the piezoelectric layer 240. The interleaved metal electrodes may also be referred to as fingers. In this example, the first transducer 220 may be configured to convert the first electrical signal into the surface acoustic wave within a narrow frequency band, and the second transducer 225 may be configured to convert the surface acoustic wave into the second electrical signal within the narrow frequency band. Thus, in this example, the device 230 implements a SAW filter that passes signals within the narrow frequency band, and therefore functions as a bandpass filter. In this example, the narrow frequency band may be determined by the lengths of the electrodes (i.e., fingers) in the first and second transductors 220-1 to 220-2.

Figure 3:
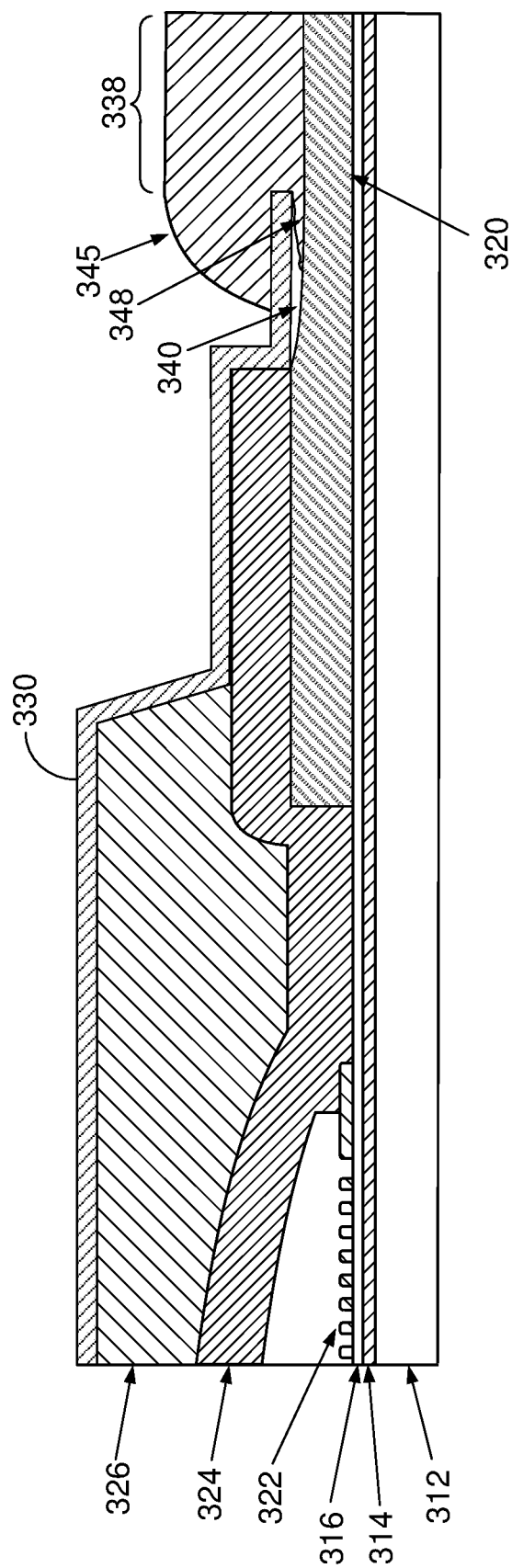
FIG. 3 shows an example of lateral under etching between a pad and a passivation layer according to certain aspects of the present disclosure.

FIG. 3 shows a cross-sectional view of a portion of a chip according to aspects of the present disclosure. The chip may correspond to the exemplary chip 105 shown in FIG. 1. In this example, the chip includes a substrate 312, which may correspond to the substrate 110 shown in FIG. 1. The substrate 312 may comprise silicon and/or another material.

In this example, the chip includes a SAW filter (e.g., the SAW filter shown in FIG. 2B), a portion of which is shown in FIG. 3. In this example, the SAW filter includes a piezoelectric layer 316, and two or more transducers (e.g., transducers 242 and 244). Each of the transducers includes interleaved metal electrodes (i.e., fingers) deposited on the top surface of the piezoelectric layer 316. FIG. 3 shows an example of metal electrodes 322 (i.e., fingers) for one of the transducers.

In the example in FIG. 3, the chip includes a high-resistance layer 314 between the piezoelectric layer 316 and the substrate 312. In this example, the high-resistance layer 314 is used to prevent charge on the bottom surface of the piezoelectric layer 316 from leaking into the substrate 312, which degrades the performance of the SAW filter. The high-resistance layer 314 may be formed by irradiating a silicon layer, which creates structural defects in the silicon layer that increases resistance. It is to be appreciated that the high-resistance layer 314 may be omitted in some implementations. For example, the high-resistance layer 314 may be omitted for the case where the resistance of the substrate 312 is already high enough to substantially reduce charge leakage from the piezoelectric layer 316 into the substrate 312.

In the example in FIG. 3, the chip also includes a pad 320, which may correspond to one of the exemplary pads 120-1 to 120-3 shown in FIG. 1. Note that FIG. 3 shows a portion of the pad 320 and that the pad 320 extends laterally to the right. The pad 320 may comprise aluminum, copper, aluminum copper (AlCu), etc. In certain aspects, the pad 320 may comprise a metal stack in which the top metal layer in the metal stack comprises aluminum. As discussed above, a UBM 345 and a solder bump (not shown in FIG. 3) may be deposited on the pad 320 to electrically couple the pad 320 to external circuitry. The chip may include an interconnect (not shown in FIG. 3) electrically coupling the pad 320 to the SAW filter (e.g., one or more of the electrodes 322 shown in FIG. 3). The interconnect may correspond to one of the exemplary interconnects 222-1 and 222-2 shown in FIG. 2B.

In the example in FIG. 3, the chip includes a first passivation layer 324 that forms a dome over the metal electrodes 322 (i.e., fingers) of the SAW filter. The first passivation layer 324 may comprise silicon oxide ($SiO_2$) and/or another material. The first passivation layer 324 may be used to provide a barrier that protects the structure of the SAW filter from moisture and/or particles from the outside environment. In the example in FIG. 3, a portion the first passivation layer 324 extends over a portion of the pad 320.

The chip also includes a second passivation layer 326 formed over the first passivation layer 324. The second passivation 326 may comprise benzocyclobutene (BCB) and/or another material. The second passivation layer 326 provides mechanical support for the first passivation layer 324, and provides additional protection from the outside environment.

The chip also includes a third passivation layer 330 formed over the first and second passivation layers 324 and 326, and a portion of the pad 320. The third passivation 330 may comprise silicon nitride (SiN) and/or another material that provides a good barrier to moisture. In this example, the third passivation 330 provides additional protection from moisture by forming a moisture seal over the first and second passivation layers 324 and 326.

During fabrication, the third passivation layer 330 may be deposited over the first and second passivation layers 324 and 326 and the pad 320. After deposition of the third passivation layer 330, a portion of the third passivation layer 330 covering the pad 320 is removed (e.g., using an etchant) to expose a portion 338 of the pad 320 for bumping. The exposed portion 338 of the pad 320 provides an electrical contact surface for electrically coupling the UBM 345 to the pad 320. Note that FIG. 3 shows a portion of the pad 320 and the UBM 345, and that the pad 320 and the UBM 345 extend laterally to the right.

The UBM 345 may be an electroless UBM that is deposited on the pad 320 using an electroless plating process (also referred to electroless deposition). A problem with the electroless process is that the electroless process may cause lateral under etching of the pad 320 underneath the third passivation layer 330. An example of this is shown in FIG. 3, in which lateral under etching etches away a portion of the pad 320 underneath the third passivation layer 330, forming a hole 340 (i.e., a void) between the third passivation layer 330 and the pad 320. The hole 340 may extend laterally to the left all the way to the first passivation layer 324. In some cases, a small portion 348 of the UBM 345 may flow into the hole 340. The hole 340 reduces the mechanical stability of the third passivation layer 330, increasing the risk of cracking in the third passivation layer 330. In some cases, the cracking may cause a portion of the third passivation layer 330 to break off.

To address the above problem, aspects of the present disclosure provide an adhesion layer between the third passivation layer 330 and the pad 320. The adhesion layer provides improved adhesion with the third passivation layer 330. The improved adhesion prevents the lateral under etching discussed above, and therefore prevents formation of the hole 340 (i.e., void) between the third passivation layer 330 and the pad 320. This improves the mechanical stability of the third passivation layer 330.

Figure 4:
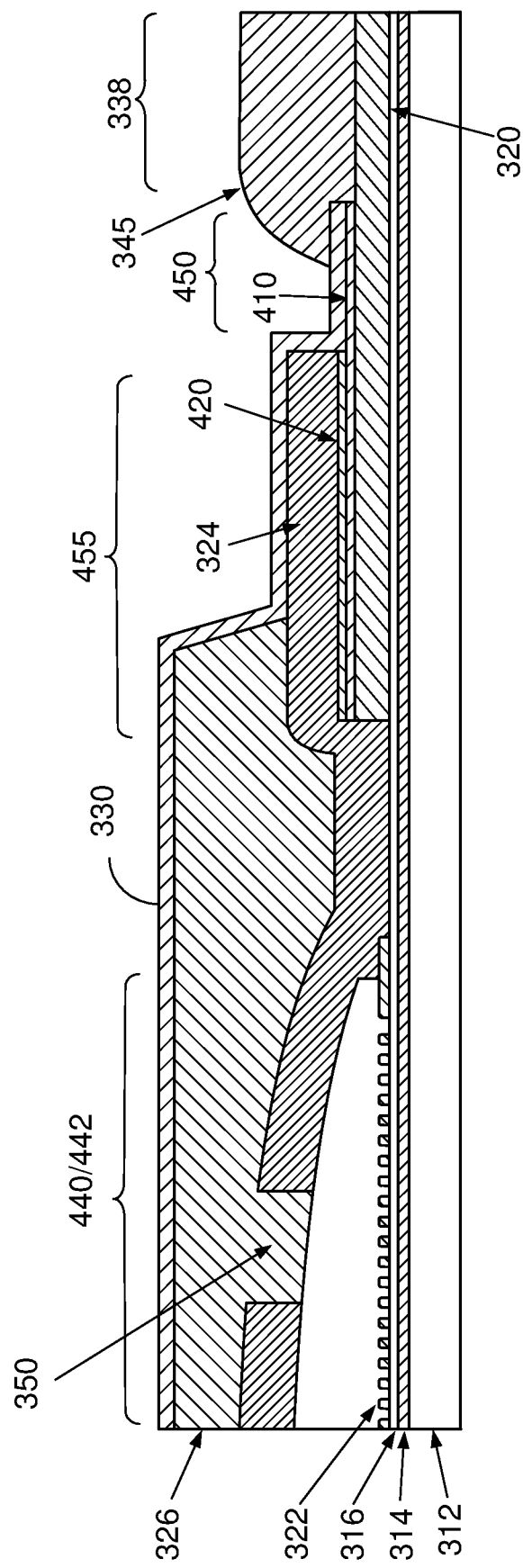
FIG. 4 shows an example of an adhesion layer between the pad and the passivation layer to help prevent lateral under etching according to certain aspects of the present disclosure.

FIG. 4 shows an example in which the chip in FIG. 3 further includes a first metal layer 410 and a second metal layer 420 according to aspects of the present disclosure. The first metal layer 410 is between the pad 320 and the third passivation layer 330. The first metal layer 410 provides good adhesion with the third passivation layer 330, which helps prevent lateral under etching under the third passivation layer 330, and therefore helps prevent formation of the hole 340 (i.e., void) discussed above. In this respect, the first metal layer 410 functions as the adhesion layer discussed above. In one example, the pad 320 may comprise aluminum, the first metal layer 410 may comprise titanium, and the third passivation layer 330 may comprise silicon nitride. However, it is to be appreciated that the present disclosure is not limited to this example, as discussed further below. The first metal layer 410 may have a thickness of between 10 nm to 300 nm.

The second metal layer 420 is between a portion of the first metal layer 410 and the first passivation layer 324, as shown in FIG. 4. In one example, the second metal layer 420 may be used to protect the first metal layer 410 from the etchant used to etch the first passivation layer 324 during fabrication. In another example, the second metal layer 420 may be used to provide an electrical contact surface for performing electrical measurements, as discussed further below. In one example, the second metal layer 420 may comprise aluminum. However, it is to be appreciated that the present disclosure is not limited to this example and that the second metal layer 420 may comprise another material, as discussed further below. The second metal layer 420 may have a thickness of between 10 nm to 300 nm.

As shown in FIG. 4, a portion 440 of the first passivation layer 324 extends over the metal electrodes 322 (i.e., fingers), and a portion 442 of the third passivation layer 330 extends over the metal electrodes 322 and the portion 440 of the first passivation layer 324. The second passivation layer 326 is between the first passivation layer 324 and the third passivation layer 330. Also, a portion 450 of the third passivation layer 330 extends over a portion of the first metal layer 410 and a portion of the pad 320. In certain aspects, the portion of the first metal layer 410 between the portion 450 of the third passivation layer 330 and the pad 320 functions as an adhesion layer that helps prevent lateral under etching under the third passivation layer 330, as discussed above. Also, a portion 455 of the first passivation layer 324 extends over a portion of the pad 320, a portion of the first metal layer 410, and the second metal layer 420. FIG. 4 also shows the UBM 345 deposited on the exposed portion 338 of the pad 320 to electrically couple the UBM 345 to the pad 320. As shown in FIG. 4, the UBM 345 extends partially over the third passivation layer 330 and the first metal layer 410.

It is to be appreciated that designations such as "first," "second," and so forth in the present disclosure do not generally limit the quantity or order of elements in the present disclosure. Rather, these designations are used herein as a convenient way of distinguishing between two or more elements or instances of an element. Accordingly, it is to be appreciated that the designations "first," "second," and so forth in the claims do not necessarily correspond to the same designations in the written description. For example, a first passivation layer in the claims may correspond to the third passivation layer 330, a second passivation layer in the claims may correspond to the first passivation 324, and a third passivation layer in the claims may correspond to the second passivation layer 326.

Exemplary fabrication processes for fabricating the exemplary chip shown in FIG. 4 will now be discussed with reference to FIGS. 5A to 5H according various aspects of the present disclosure. It is to be appreciated that during fabrication the chip may be part of a wafer comprising multiple chips.

Figure 5A:
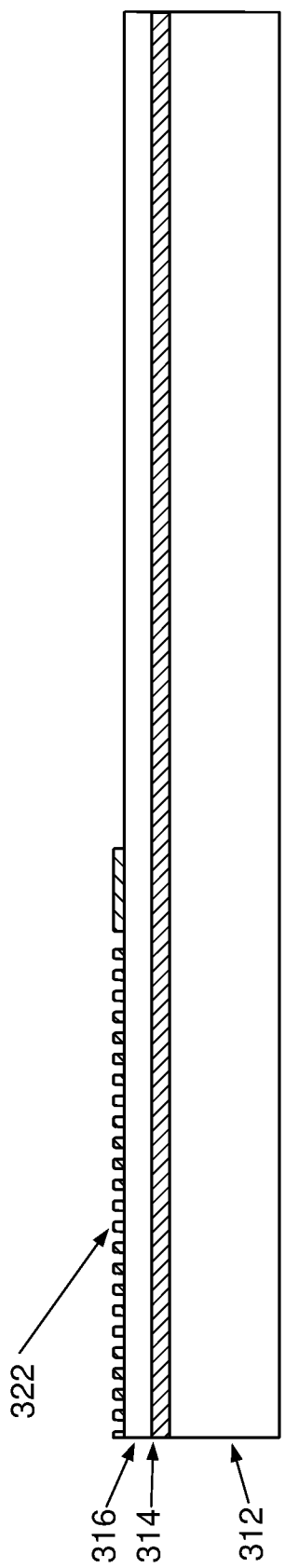
FIG. 5A illustrates an example in which metal electrodes are formed on a piezoelectric layer according to certain aspects of the present disclosure.

FIG. 5A shows an example in which the high-resistance layer 314 is deposited on the substrate 312 (e.g., silicon substrate), and the piezoelectric layer 316 is deposited on the high resistance layer 314. As discussed above, the high-resistance layer 314 may be omitted in some implementations, in which case the piezoelectric layer 316 may be deposited on the substrate 312. The metal electrodes 322 of the SAW filter are then formed on the top surface of the piezoelectric layer 316. For example, the metal electrodes may be formed by depositing a metal layer on the piezoelectric layer 316 and patterning the metal layer to form the metal electrodes 322 using a lithographic and etching process. A lithographic and etching process may include coating a layer (e.g., a metal layer) with a resist, patterning the resist using lithography to expose portion(s) of the layer to be removed, etching away the exposed portion(s) of the layer using an etchant, and removing the remaining resist.

Figure 5B:
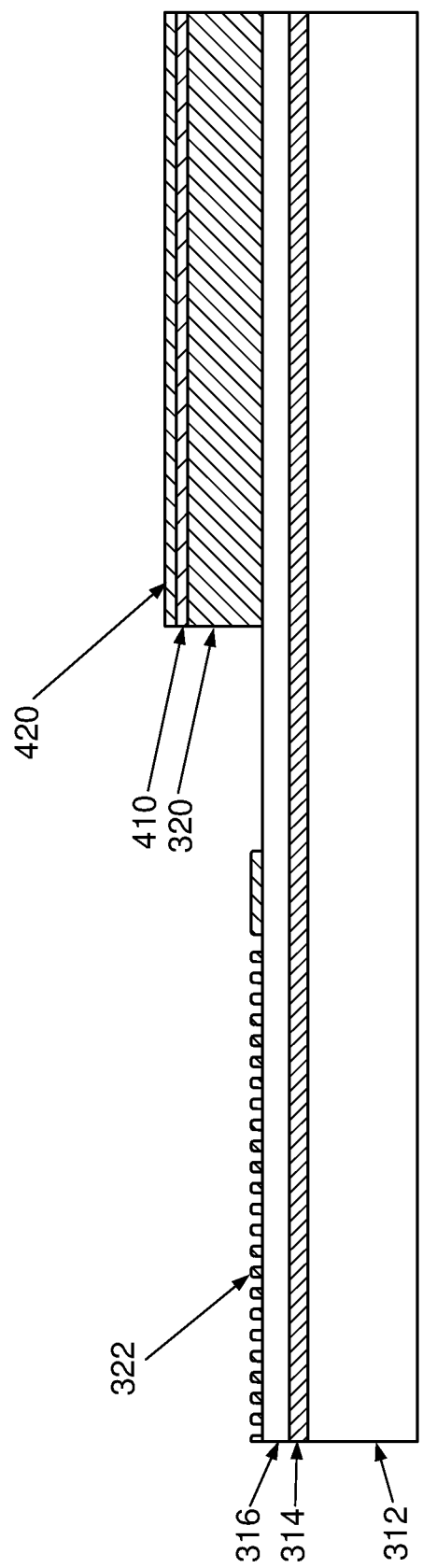
FIG. 5B illustrates an example in which a pad is formed, and first and second metal layers are formed on the pad according to certain aspects to certain aspects of the present disclosure.

FIG. 5B shows an example in which the pad 320 is formed on a portion of the piezoelectric layer 316. The pad 320 may be formed by depositing one or more metal layers on the piezoelectric layer 316 and patterning the one or more metal layers to form the pad 320 using a lithographic and etching process. In certain aspects, the piezoelectric layer 316 and the high-resistance layer 314 may be removed from the area where the pad 320 is to be located prior to formation of the pad 320. In these aspects, the pad 320 may be formed on the substrate 312. In certain aspects, the pad 320 may comprise a stack of metal layers (i.e., metal stack). In these aspects, the top metal layer in the metal stack may comprises aluminum or another metal. Exemplary metal layers that may be included in the metal stack are discussed further below with reference to FIG. 6.

In the example shown in FIG. 5B, the first metal layer 410 is formed on the pad 320, and the second metal layer 420 is formed on the first metal layer 410. In one example, the first metal layer 410 may comprise titanium and the second metal layer 420 may comprise aluminum. In certain aspects, the first and second metal layers 410 and 420 may be patterned during the same lithographic and etching process used to form the pad 320. At this stage, the first and second metal layers 410 and 420 cover the entire top surface of the pad 320. As discussed further below, portions of the first and second metal layers 410 and 420 are removed in subsequent process steps to expose an area of the pad 320 for bumping.

A thin passivation layer (e.g., not shown) may be deposited on the metal electrodes 322 to protect the metal electrodes 322 from corrosion. In one example, the thin passivation layer may have a thickness of approximately 10 nm and may comprise silicon nitride. The thin passivation layer may be deposited using plasma-enhanced chemical vapor deposition (PECVD). Also, a metal interconnect (not shown in FIG. 5B) may be formed to electrically couple the pad 320 to one or more of the metal electrodes 322. The metal interconnect may be formed from the same metal layer used to form the metal electrodes 322 and/or a portion of the pad 320. In another example, the metal interconnect may be formed from a separate metal layer.

Figure 5C:
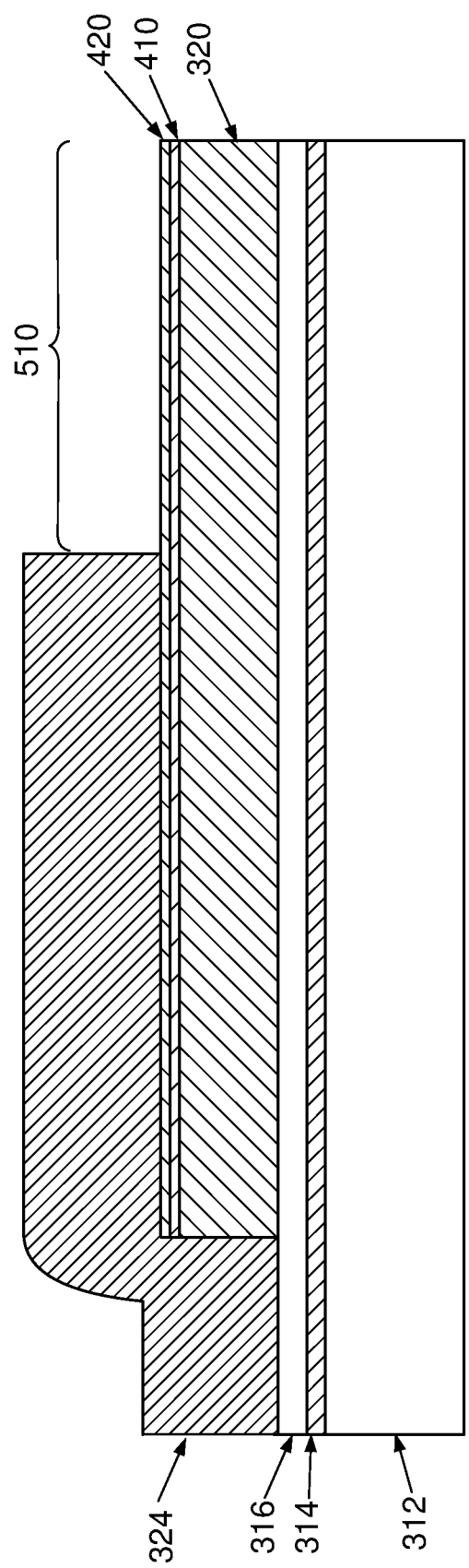
FIG. 5C illustrates an example in which a first passivation layer is formed according to certain aspects of the present disclosure.

FIG. 5C shows an example in which first passivation layer 324 is formed on the chip. In one example, the first passivation layer 324 may be deposited on the chip (e.g., using PECVD) and may comprise silicon oxide ($SiO_2$) or another material. The portion 440 of the first passivation layer 324 located above the metal electrodes 322 forms a dome (shown in FIG. 4) above the metal electrodes 322. This may be accomplished by forming a sacrificial layer (not shown) in the shape of the dome over the metal electrodes 322, depositing the first passivation layer 324 over the sacrificial layer, and removing the sacrificial layer. In certain aspects, the sacrificial layer may be removed through one or more holes 350 (shown in FIG. 4) formed in the third passivation layer 324.

As shown in FIG. 5C, a portion of the first passivation layer 324 covering the second metal layer 420 is removed to expose an area 510 of the second metal layer 420. This portion of the first passivation layer 324 may be removed using a lithographic and etching process. The same lithographic and etching process may be used to form the one or more holes 350 (shown in FIG. 4) in the first passivation layer 324. In certain aspects, the second metal layer 420 may be inert to the etchant (e.g., dry etchant) used to etch the first passivation layer 324. In one example, the etchant used to etch the first passivation layer 324 may include a mixture of fluorochemical gases. In these aspects, the second metal layer 420 is stable against the etching process used for the first passivation layer 324. It is to be appreciated that FIG. 5C shows a portion of the first and second metal layers 410 and 410 and the pad 320, and that the first and second metal layers 410 and 410 and the pad 320 extend laterally to the right.

Figure 5D:
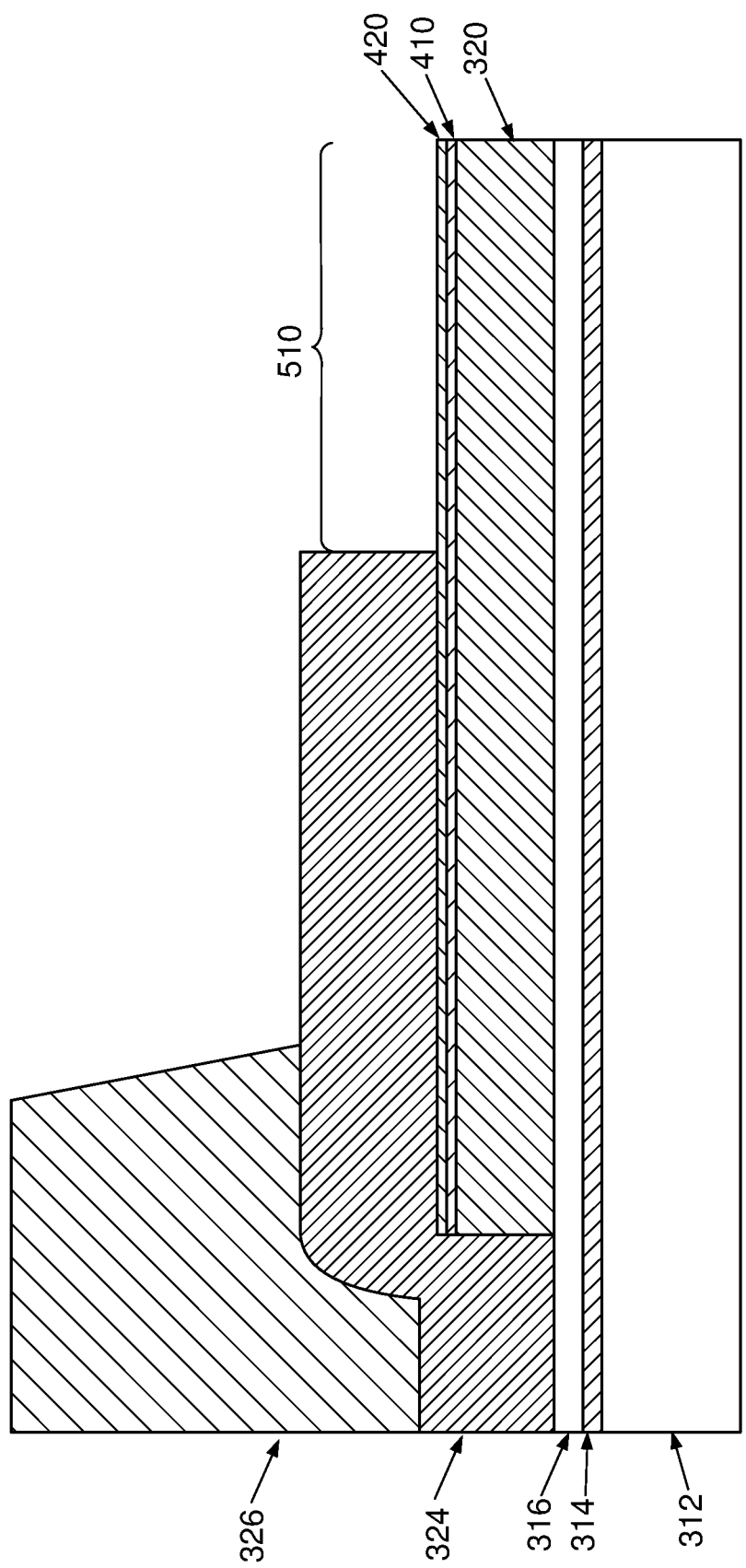
FIG. 5D illustrates an example in which a second passivation layer is formed over the first passivation layer according to certain aspects of the present disclosure.

FIG. 5D shows an example in which second passivation layer 326 is formed on the chip. In one example, the second passivation layer 324 may be deposited on the chip and patterned using a lithographic and etching process. The second passivation layer 326 may comprise BCB or another material.

At this stage, electrical measurements may be performed on the chip (e.g., to test internal connections in the chip). To perform the electrical measurements, a probe of a tester may be placed on the exposed area 510 of the second metal layer 420 to electrically couple the pad 320 to the tester via the first and second metal layers 410 and 420. Thus, in this example, the portion of the second metal layer 420 in the exposed area 510 provides an electrical contact surface for the probe. In certain aspects, the second metal layer 420 may comprise a relatively soft metal (e.g., aluminum) to prevent damage to the probe. For example, aluminum is a softer metal than titanium. Thus, for the example in which the first metal layer 410 comprises titanium and the second metal layer 420 comprises aluminum, the second metal layer 420 provides a softer electrical contact surface for the probe compared with the first metal layer 410, and therefore reduces the likelihood of damage to the probe.

Figure 5E:
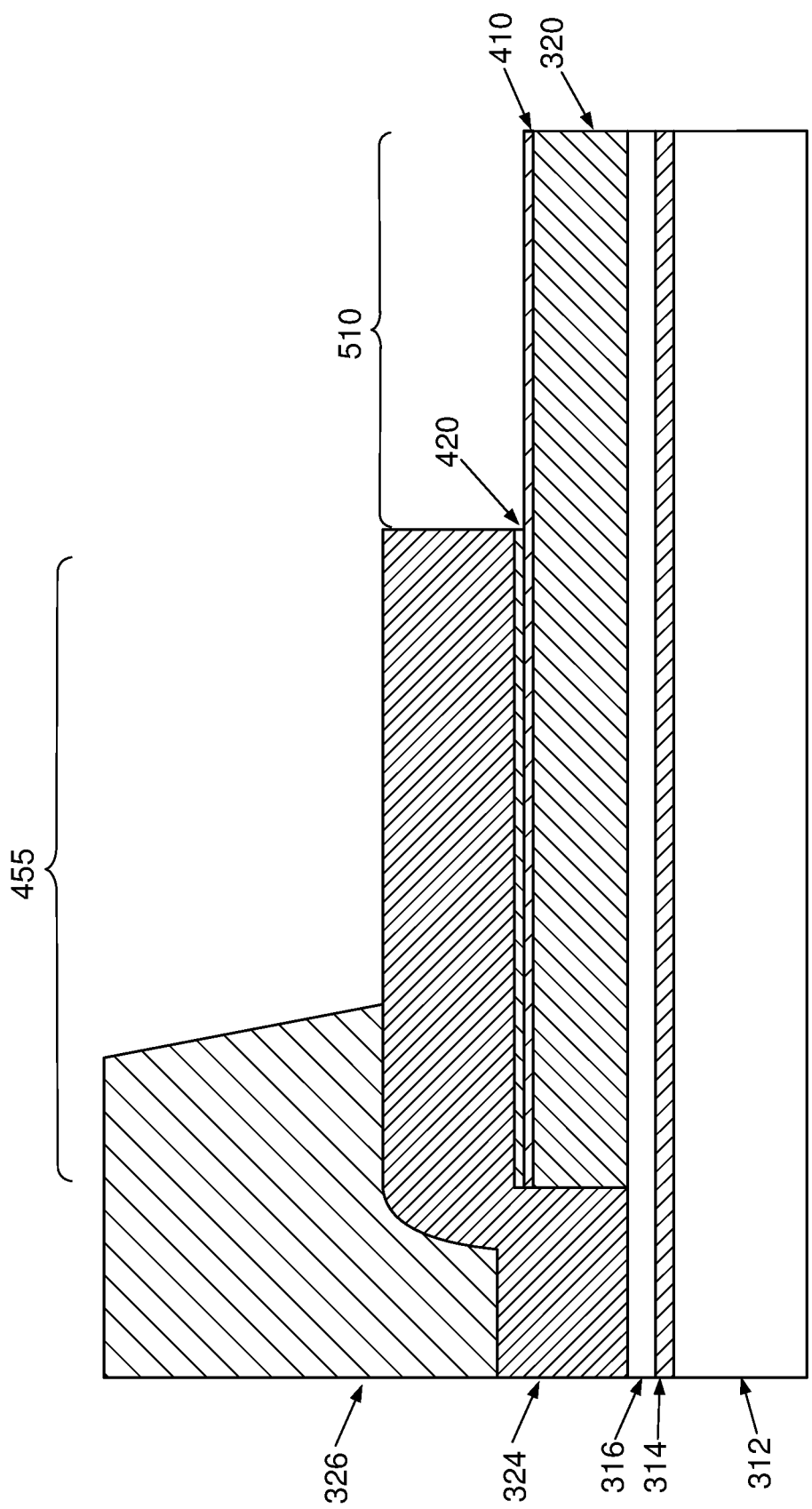
FIG. 5E illustrates an example in which a portion of the second metal layer on the pad is removed according to certain aspects of the present disclosure.

FIG. 5E shows an example in which the portion of the second metal layer 420 in the exposed area 510 is removed using a dry etchant or a wet etchant. In one example, the etchant used to remove the exposed area 510 of the second metal layer 420 may include a mixture of inorganic acids or inorganic base. In this example, the portion of the second metal layer 420 under the portion 455 of the first passivation layer 324 remains after the etching process.

Figure 5F:
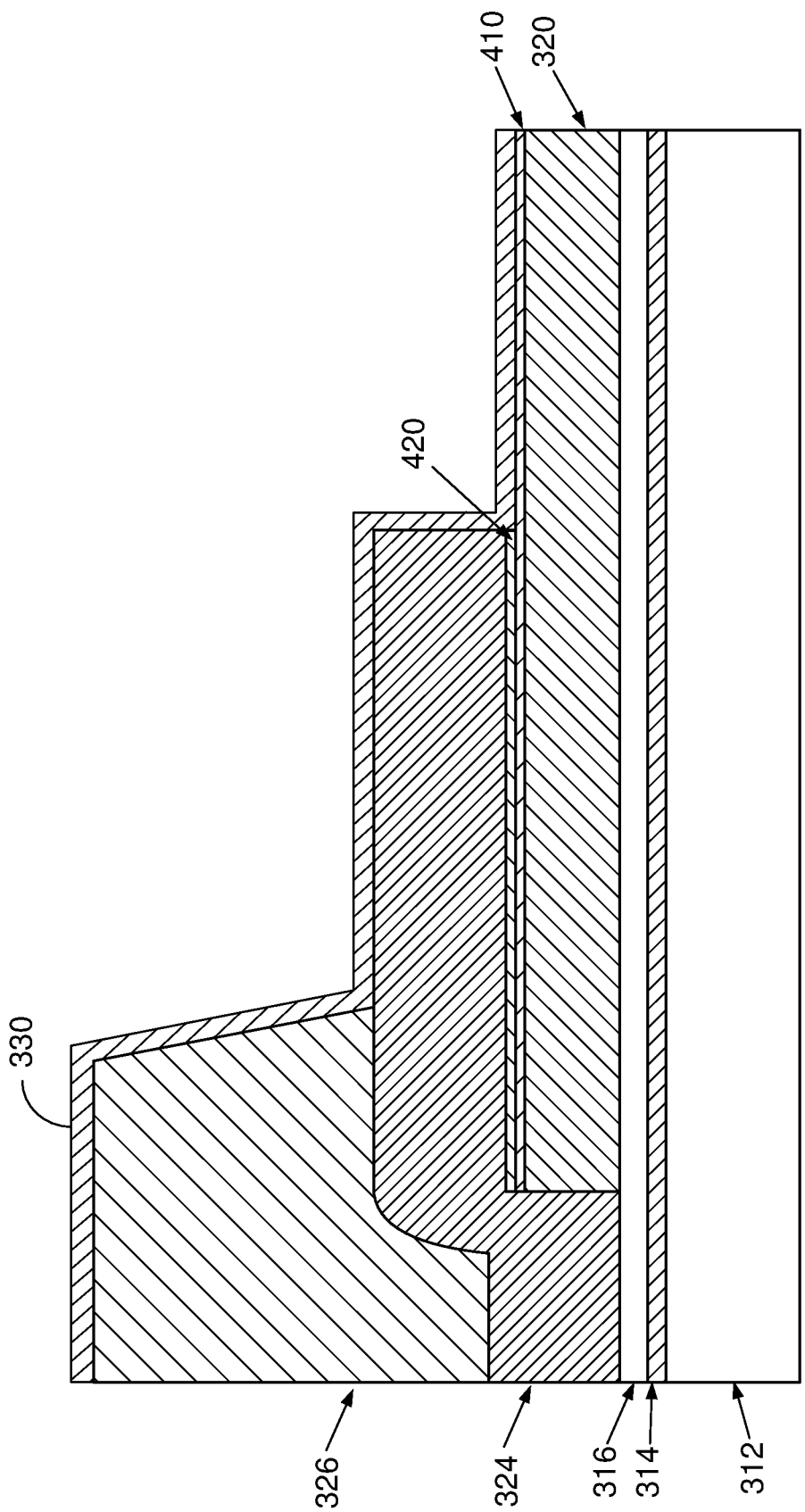
FIG. 5F illustrates an example in which a third passivation layer is deposited over the second passivation layer, the first passivation layer, and the pad according to aspects of the present disclosure.

FIG. 5F shows an example in which the third passivation layer 330 is deposited on the chip (e.g., using PECVD). The third passivation layer 330 may comprise silicon nitride (SiN) or another material.

Figure 5G:
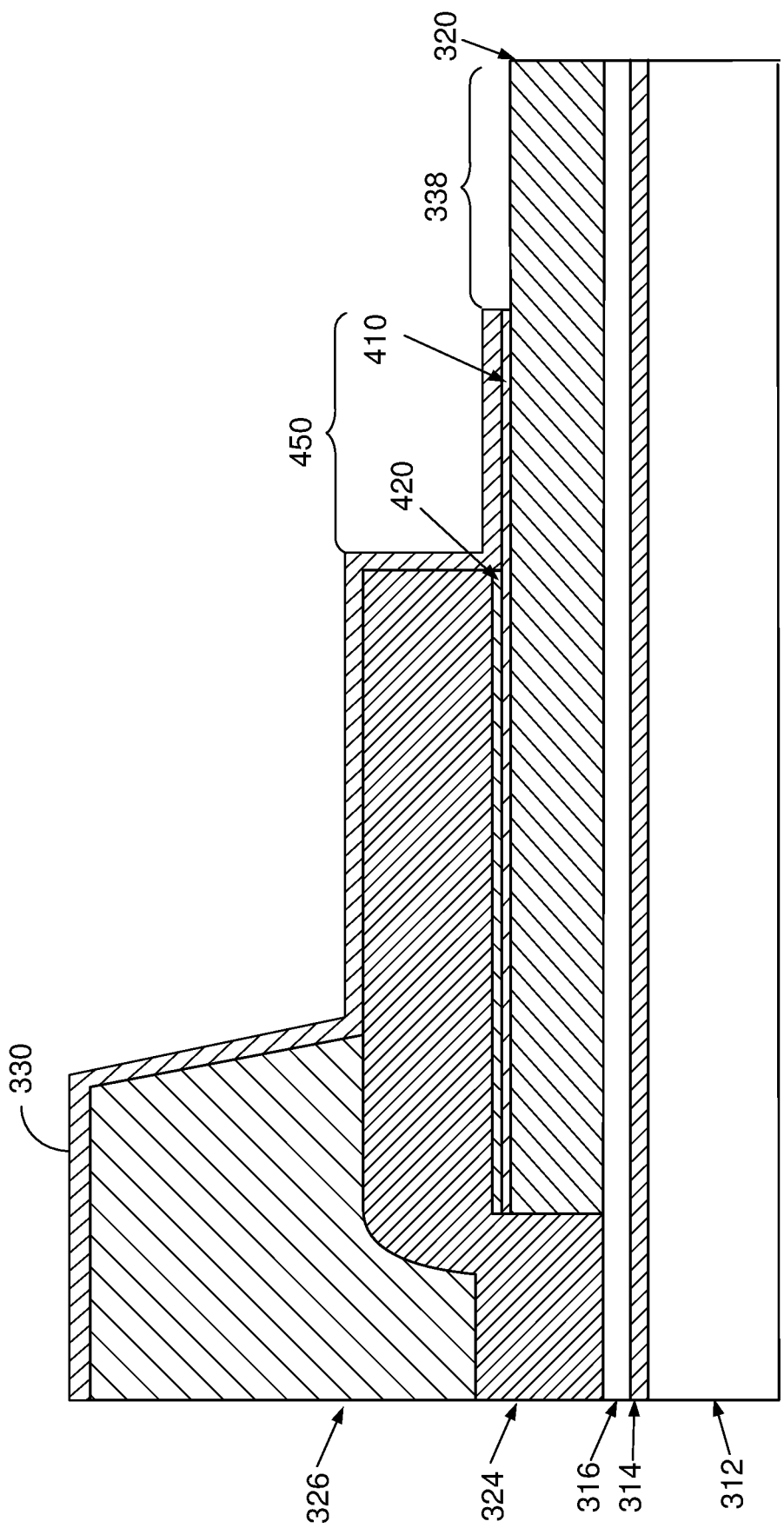
FIG. 5G illustrates an example in which a portion of the third passivation layer and a portion of the first metal layer are removed to expose an area of the pad according to aspects of the present disclosure.

FIG. 5G shows an example in which a portion of the third passivation layer 330 and a portion of the first metal layer 410 over the pad 320 are removed to expose a portion 338 of the pad 320. The exposed portion 338 of the pad 320 provides the electrical contact surface for electrically coupling the UBM 345 (not shown in FIG. 5G) to the pad 320. In certain aspects, the third passivation layer 330 and the first metal layer 410 may be patterned to expose the portion 338 of the pad 320 using a lithographic and etching process. In the example in FIG. 5G, the portion 450 of the third passivation layer 330 extends over a portion of the first metal layer 410 and a portion of the pad 320. The portion 450 of the third passivation layer 330 extending over the pad 320 may be protected from the etchant (e.g., a mixture of fluorochemical gases) used in the etching process by a resist (not shown) that is patterned using lithography.

Figure 5H:
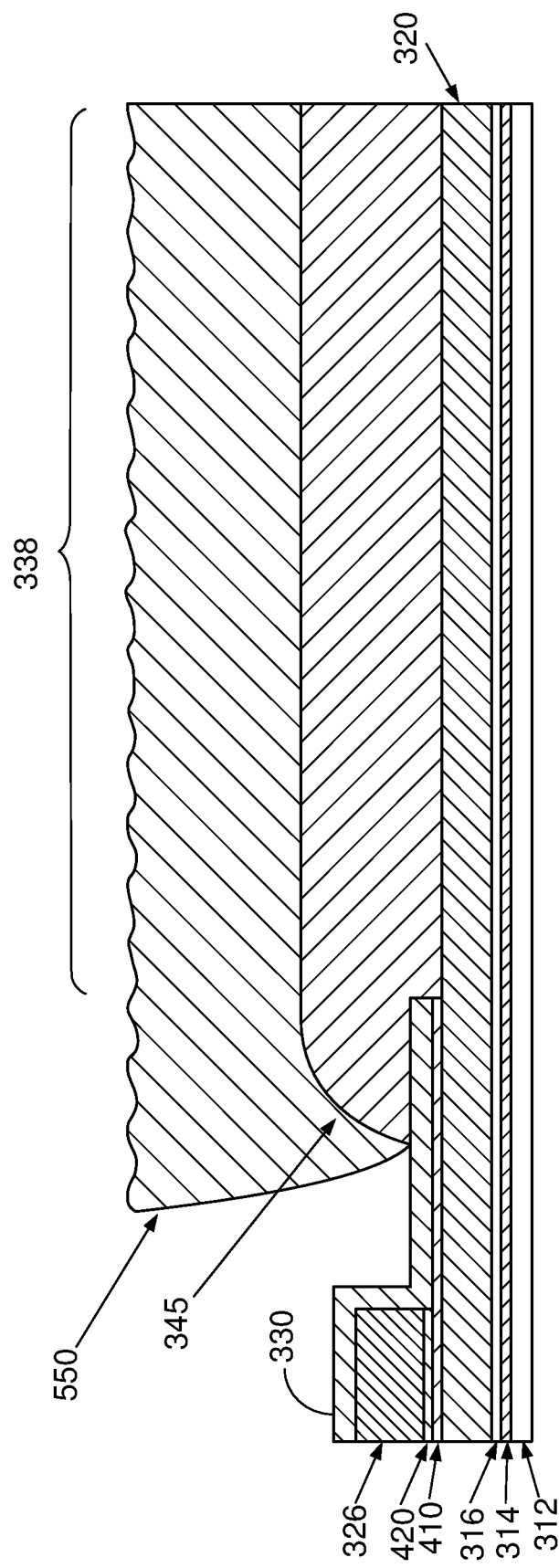
FIG. 5H shows an example in which a UBM and a solder bump are deposited on the pad according to certain aspects of the present disclosure.

FIG. 5H shows an example in which the UBM 345 is deposited on the portion 338 of the pad 320. The UBM 345 may correspond to one of the UBMs 125-1 to 125-3 shown in FIG. 1. In one example, the UBM 345 may comprise nickel with a thin outer layer of gold and/or palladium. In this example, the nickel may be deposited on the pad 320 using electroless nickel plating and the thin layer of gold may be deposited on the nickel using immersion gold plating. In one example, the nickel may have a thickness of approximately 5.5 µm and the gold may have a thickness of approximately 50 to 60 nm. In this example, the UBM 345 may make contact with the surface of the portion 338 of the pad 320. Note that the third passivation layer 330 and the first metal layer 410 do not extend over the portion 338 of the pad 320. As shown in FIG. 5H, the UBM 345 extends partially over the third passivation layer 330 and the first metal layer 410.

As discussed above, the UBM 345 may be deposited using an electroless process. In this example, the portion of the first metal layer 410 underneath the third passivation layer 330 provides good adhesion with the third passivation layer 330. The good adhesion helps prevent lateral under etching under the third passivation layer 330 (e.g., during electroless process), and therefore helps prevent formation of the hole 340 (i.e., void) discussed above with reference to FIG. 3. This improves the mechanical stability of the third passivation layer 330.

In the example in FIG. 5H, a solder bump 550 is deposited on the UBM 345. The solder bump 550 may correspond to one of the solder bumps 130-1 to 130-3 shown in FIG. 1. It is to be appreciated that a portion of the solder bump 550 is shown in FIG. 5H. Also, it is to be appreciated that FIG. 5H shows a larger view of the pad 320 compared with FIG. 5G in order to better illustrate the UBM 345 and the solder bump 550.

The first metal layer 410 is not limited to the example of titanium discussed above. In other examples, the first metal layer 410 may comprise tungsten or chromium. Also, the second metal layer 420 is not limited to the example of aluminum. In another example, the second metal layer 420 may comprise an aluminum copper (AlCu) alloy. Further, the third passivation layer 330 is not limited to the example of silicon nitride (SiN) discussed above. In other examples, the third passivation layer 330 may comprise silicon oxide ($SiO_2$), aluminum oxide ($Al_2O_3$) or aluminum nitride (AlN). Table 1 below shows various combinations of materials that may be used for the pad 320, the first metal layer 410, the second metal layer 420, and the third passivation layer 330. In Table 1, each row shows an exemplary combination of materials. In Table 1, a slash is inserted between alternatives. For example, Al/AlCu indicates aluminum or aluminum copper (AlCu) alloy. For the example in which the pad 330 comprises a metal stack, the material listed in Table 1 for the pad 330 indicates the material for the top metal layer in the metal stack.

TABLE 1

| Pad | First Metal Layer | Second Metal Layer | Third Passivation layer |
|---|---|---|---|
| Al | Ti | Al/AlCu | $SiN/Al_2O_2/AlN/SiO_2$ |
| Al | W | Al/AlCu | $SiN/Al_2O_2/AlN/SiO_2$ |
| Al | Cr | Al/AlCu | $SiN/Al_2O_2/AlN/SiO_2$ |
| AlCu | Ti | Al/AlCu | $SiN/Al_2O_2/AlN/SiO_2$ |
| AlCu | W | Al/AlCu | $SiN/Al_2O_2/AlN/SiO_2$ |
| AlCu | Cr | Al/AlCu | $SiN/Al_2O_2/AlN/SiO_2$ |
| Cu | Ti | Al/AlCu | $SiN/Al_2O_2/AlN/SiO_2$ |
| Cu | Cr | Al/AlCu | $SiN/Al_2O_2/AlN/SiO_2$ |

Figure 6:
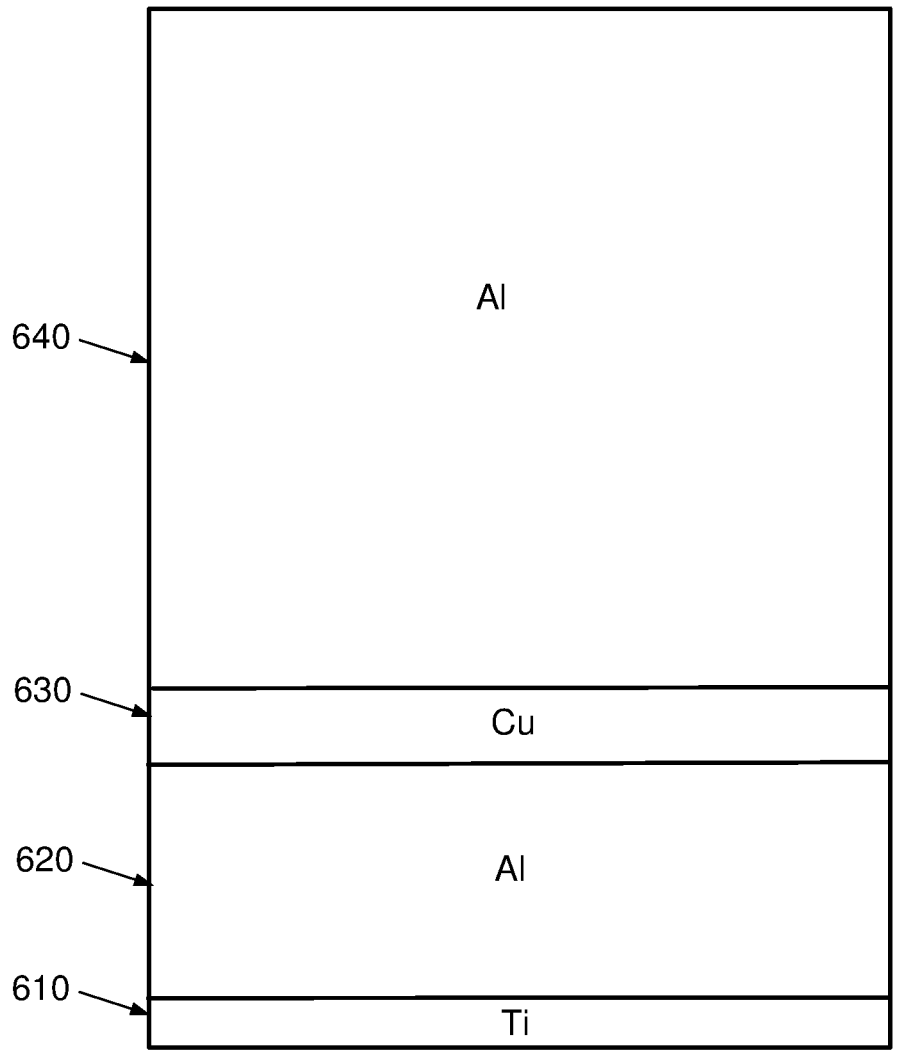
FIG. 6 shows an example of a metal stack according to certain aspects of the present disclosure.

As discussed above, the pad 320 may comprise a metal stack. In this regard, FIG. 6 shows an example of a metal stack 605 for the pad 320. In this example, the metal stack 605 includes a first layer 610, a second layer 620 above the first layer 610, a third layer 630 above the second layer 620, and a fourth layer 640 above the third layer 630. The first and second metal layers 410 and 420 (not shown in FIG. 6) are deposited on top of the fourth metal layer 640. The top surface of the fourth metal layer 640 provides the contact surface 338 for bumping. In one example, the first layer 610 comprises titanium, the second layer 620 comprises aluminum, the third layer 630 comprises copper, and the fourth layer 640 comprises aluminum. In one example, the first layer 610 may have a thickness of approximately 30 nm, the second layer 620 may have a thickness of approximately 470 nm, the third layer 630 may have a thickness of approximately 15 nm, and the fourth layer 640 may have a thickness of approximately 2 µm. In certain aspects, the thickness of the first layer 610 may be 5 nm to 50 nm, the thickness of the second layer 620 may be 500 nm to 800 nm, the thickness of the third layer 630 may be 5 nm to 50 nm, and the thickness of the fourth layer 640 may be one µm to 3 µm. It is to be appreciated that the thicknesses of the layers 610 to 640 are not limited to the example thicknesses given above. It is also to be appreciated that the metal stack 605 may include fewer layers than shown in the example in FIG. 6 or more layers than shown in the example in FIG. 6.

Figure 7:
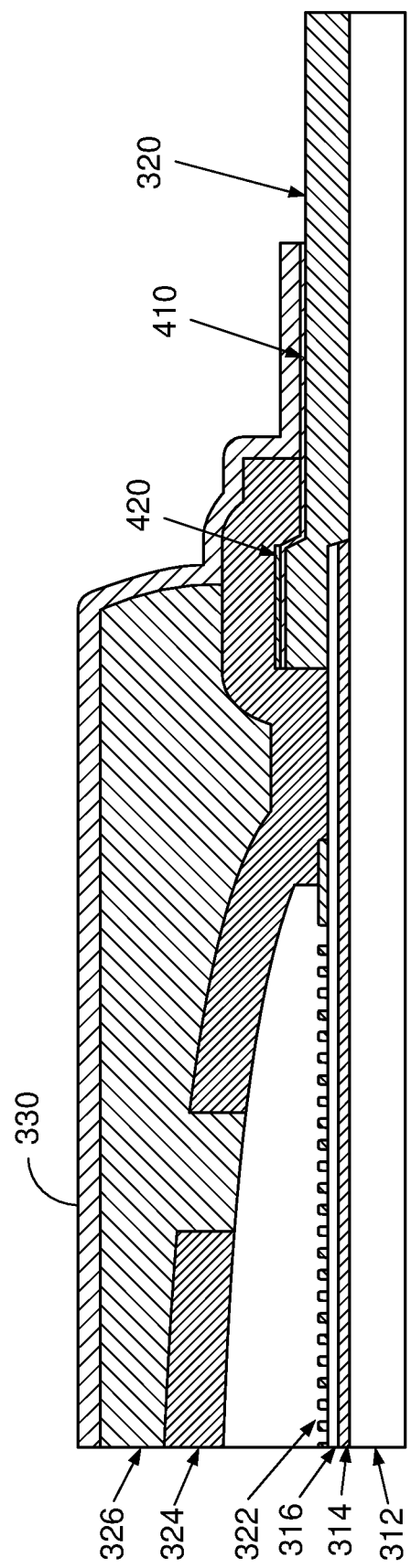
FIG. 7 shows an example in which a portion of a piezoelectric layer is removed in an area of chip in which a pad is located according to certain aspects of the present disclosure.

As discussed above with reference to FIG. 5B, the piezoelectric layer 316 and the high-resistance layer 314 may be removed from the area of the chip in which the pad 320 is to be located. In this example, after the portion of the piezoelectric layer 316 and the portion of the high-resistance layer 314 are removed, the remaining structures of the chip may be formed using the exemplary processes illustrated in FIGS. 5C to 5H. An example of the resulting chip is illustrated in FIG. 7.

Figure 8:
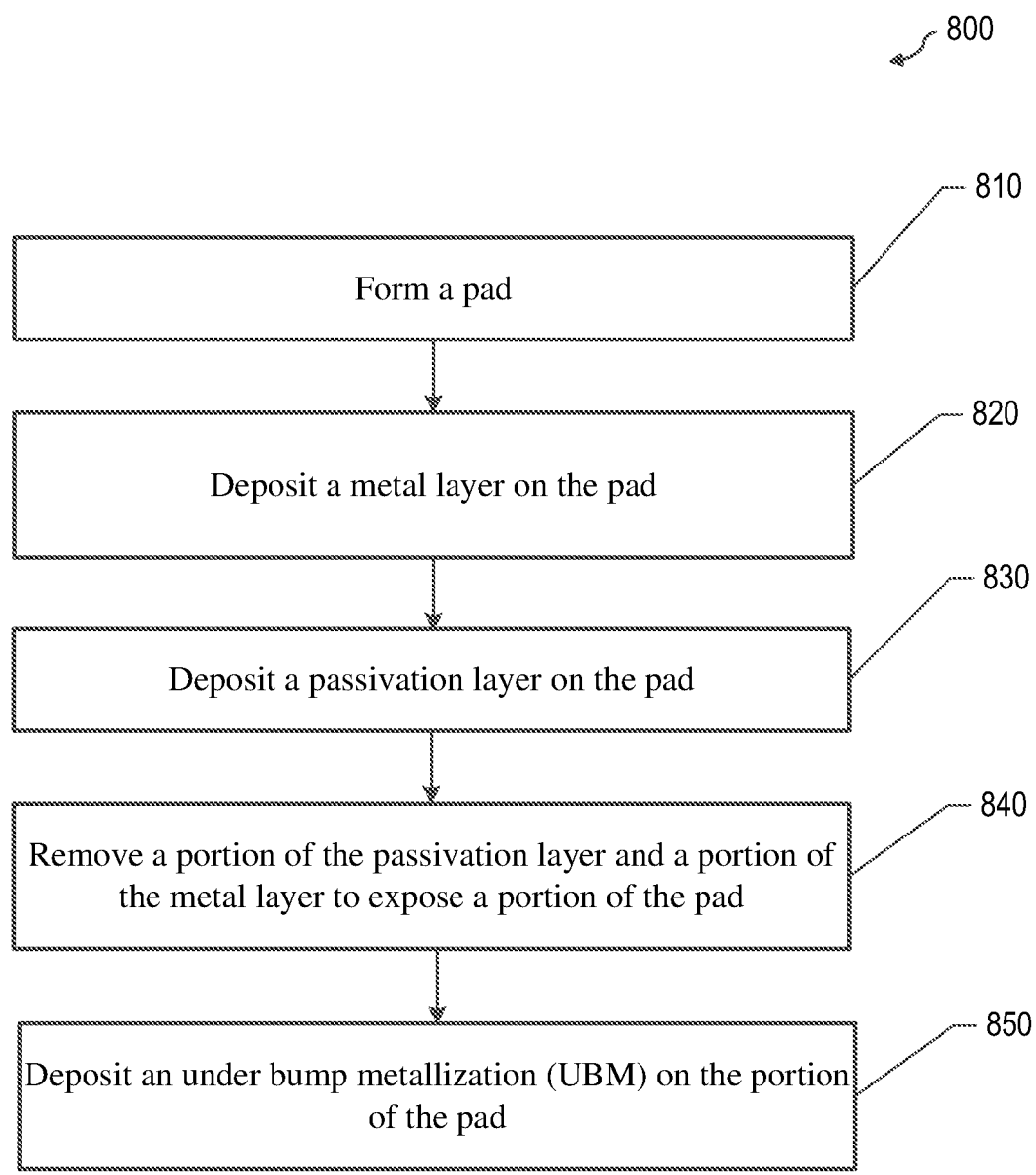
FIG. 8 is a flowchart illustrating a method of manufacture according to certain aspects of the present disclosure.

FIG. 8 is a flowchart illustrating an exemplary method of manufacture according to certain aspects of the present disclosure.

At block 810, a pad is formed. The pad (e.g., pad 320) may comprise aluminum, an aluminum copper alloy, or copper. In certain aspects, the pad 320 may be coupled to one or more metal electrodes 322 on a piezoelectric layer 316.

At block 820, a metal layer is deposited on the pad. The metal layer may correspond to the first metal layer 410, and may comprise titanium, choromium, or tungsten.

At block 830, a passivation layer is deposited over the metal layer. The passivation layer may correspond to the third passivation 330, and may comprise silicon nitride, silicon oxide, aluminum oxide, or aluminum nitride.

At block 840, a portion of the passivation layer and a portion of the metal layer are removed to expose a portion of the pad. The portion of the pad may correspond to the exposed area 338 of the pad 330.

At block 850, an under bump metallization (UBM) is deposited on the portion of the pad. The UBM may corresponds to the UBM 345 deposited on the exposed area 338 of the pad 320.

The method 800 may optionally include depositing a solder bump (e.g., solder bump 550) on the UBM.

Any references to elements herein using designations such as "first," "second," and so forth do not generally limit the quantity or order of those elements. Rather, these designations are used herein as a convenient way of distinguishing between two or more elements or instances of an element. Accordingly, it is to be appreciated that the designations "first," "second," and so forth in the claims do not necessarily correspond to the same designations in the written description. For example, a first passivation layer in the claims may correspond to any one of the first, second and third passivation layers in the written description. Further, it is to be appreciated that a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. Within the present disclosure, the term "approximately" means within 20 percent of the stated value (i.e., between 80 percent and 120 percent of the stated value).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A chip, comprising:
   a pad;
   a first passivation layer, wherein a first portion of the first passivation layer extends over a first portion of the pad;
   a first metal layer between the first portion of the pad and the first portion of the first passivation layer; and
   an under bump metallization (UBM) electrically coupled to a second portion of the pad, wherein a first portion of the UBM is over the second portion of the pad.

2. The chip of claim 1, wherein the first metal layer comprises titanium, chromium, or tungsten.

3. The chip of claim 2, wherein the pad comprises aluminum, an aluminum copper alloy, or copper.

4. The chip of claim 2, wherein the first passivation layer comprises silicon nitride, silicon oxide, aluminum oxide, or aluminum nitride.

5. The chip of claim 1, further comprising:
   a piezoelectric layer; and
   metal electrodes on the piezoelectric layer, wherein a second portion of the first passivation layer extends over the metal electrodes.

6. The chip of claim 1, further comprising:
   a second metal layer on a portion of the first metal layer; and
   a second passivation layer, wherein a first portion of the second passivation layer extends over the second metal layer.

7. The chip of claim 6, wherein the second metal layer comprises aluminum or an aluminum copper alloy.

8. The chip of claim 7, wherein first metal layer comprises titanium, chromium, or tungsten.

9. The chip of claim 8, wherein the pad comprises aluminum, an aluminum copper alloy, or copper.

10. The chip of claim 6, wherein the second passivation layer comprises silicon oxide and the first passivation layer comprises silicon nitride, silicon oxide, aluminum oxide, or aluminum nitride.

11. The chip of claim 6, further comprising:
    a piezoelectric layer; and
    metal electrodes on the piezoelectric layer, wherein a second portion of the second passivation layer extends over the metal electrodes.

12. The chip of claim 11, wherein a second portion of the first passivation layer extends over the metal electrodes and the second portion of the second passivation layer.

13. The chip of claim 12, further comprising a third passivation layer between the second portion of the first passivation layer and the second portion of the second passivation layer.

14. The chip of claim 13, wherein the third passivation layer comprises benzocyclobutene (BCB).

15. The chip of claim 1, wherein the first metal layer has a thickness of between 10 nanometers and 300 nanometers.

16. The chip of claim 1, wherein the first passivation layer and the first metal layer do not extend over the second portion of the pad.

17. The chip of claim 16, wherein a second portion of the UBM extends partially over the first portion of the first passivation layer and the first metal layer.

18. The chip of claim 17, further comprising a solder bump on the UBM.

19. The chip of claim 1, wherein the UBM contacts a surface of the second portion of the pad.

20. The chip of claim 19, wherein a second portion of the UBM extends partially over the first portion of the first passivation layer and the first metal layer.

21. The chip of claim 20, further comprising a solder bump on the UBM.

22. The chip of claim 1, wherein the UBM comprises nickel.

23. The chip of claim 1, further comprising a solder bump on the UBM.

24. The chip of claim 1, wherein a second portion of the UBM extends partially over the first portion of the first passivation layer and the first metal layer.

25. The chip of claim 24, further comprising a solder bump on the UBM.

26. A method of manufacture, comprising:
    forming a pad;
    depositing a metal layer on the pad;

depositing a passivation layer over the metal layer;

removing a first portion of the passivation layer and a portion of the metal layer to expose a portion of the pad; and depositing an under bump metallization (UBM) on the portion of the pad and a second portion of the passivation layer.

27. The method of claim 26, further comprising depositing a solder bump on the UBM.

28. The method of claim 26, wherein the metal layer comprises titanium, chromium, or tungsten.

29. The method of claim 28, wherein the pad comprises aluminum, an aluminum copper alloy, or copper.

30. The method of claim 28, wherein the passivation layer comprises silicon nitride, silicon oxide, aluminum oxide, or aluminum nitride.

* * * * *